(12) United States Patent
Du et al.

(10) Patent No.: US 7,721,673 B2
(45) Date of Patent: May 25, 2010

(54) HOLLOW CATHODE DISCHARGING APPARATUS

(75) Inventors: Chen-Chung Du, Hsinchu Hsien (TW); Ming-Tung Chiang, Hsinchu (TW); Fu-Ching Tung, Hsinchu (TW); Chin-Feng Cheng, Hsinchu (TW); Tean-Mu Shen, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 698 days.

(21) Appl. No.: 11/700,023

(22) Filed: Jan. 31, 2007

(65) Prior Publication Data
US 2008/0106202 A1    May 8, 2008

(30) Foreign Application Priority Data
Nov. 3, 2006    (TW) .............................. 95140689 A

(51) Int. Cl.
C23C 16/00    (2006.01)
C23F 1/00    (2006.01)
H01L 21/306    (2006.01)

(52) U.S. Cl. .............................. 118/723 E; 156/345.43
(58) Field of Classification Search ................. 118/715, 118/722, 723 R, 723 E; 156/345.33, 345.34, 156/345.43, 345.44, 345.45, 345.46, 345.47; 315/111.21
See application file for complete search history.

(56) References Cited

U.S. PATENT DOCUMENTS 5,007,373 A * 4/1991 Legg et al. .............. 118/723 R
5,241,243 A    8/1993 Cirri
6,189,484 B1    2/2001 Yin et al.

FOREIGN PATENT DOCUMENTS

| EP | 0 881 865 A3 | 12/1998 |
|---|---|---|
| TW | 386237 B | 4/2000 |
| TW | 420822 B | 2/2001 |
| TW | 486718 B | 5/2002 |

OTHER PUBLICATIONS

Derwent abstract for EP 0 881 865 A2 (Dec. 2, 1998).*

* cited by examiner

*Primary Examiner*—Parviz Hassanzadeh
*Assistant Examiner*—Maureen Gramaglia
(74) *Attorney, Agent, or Firm*—Birch, Stewart, Kolasch & Birch, LLP

(57) ABSTRACT

The present invention provides a hollow cathode discharging apparatus including a hollow anode electrode, a hollow cathode electrode insulatedly fixed in the hollow anode electrode, a gas distribution pipe fixed in the hollow cathode electrode. The hollow anode electrode and the hollow cathode electrode are formed with anode openings and cathode openings respectively. Defined by the gas distribution pipe and the hollow cathode electrode and along the axis thereof is a spiral pathway winding through the cathode openings, so as to form a plurality of continuous and communicated reaction chambers. The gas distribution pipe is disposed with gas separation apertures communicated and adapted to introduce a reactive gas into the reaction chambers. The communicated reaction chambers enable uniform distribution of the reactive gas and thereby facilitate scale-up of the apparatus in axial. Accordingly, the present invention overcomes drawbacks of the prior art.

14 Claims, 4 Drawing Sheets

HOLLOW CATHODE DISCHARGING APPARATUS

BACKGROUND OF THE INVENTION

1. Field of the Invention

The present invention relates to a cathode discharging apparatus, and more particularly, to a hollow cathode discharging apparatus for generating low temperature slender plasma jets.

2. Description of the Prior Art

Hollow Cathode Discharge (HCD) is a common technique for generating low temperature plasma. Referring to FIG. 1, a conventional hollow cathode discharging apparatus 1 comprises a hollow anode electrode 11 and a hollow cathode electrode 13 enclosed by the hollow anode electrode 11. The hollow cathode electrode 13 is connected to a high frequency power generator 15 (for example, a high frequency power generator operable at a frequency of 13.56 MHz) and insulatedly spaced apart from the hollow anode electrode 11 by an insulated pipe 17 made of aluminum oxide ceramic. A reactive gas (for example, argon, helium, and nitrogen) required to generate plasma is introduced into the hollow cathode electrode 13 through an insulated gas pipe 18 penetrating the hollow anode electrode 11. Then, the reactive gas in the hollow cathode electrode 13 is ionized under high-frequency power supplied by the high frequency power generator 15. In the hollow cathode electrode 13, the free electrons collided with the reactive gas and bring high-density plasma. Then, the high-density plasma is ejected from a jet hole 19 to form a plasma jet. The plasma jet can be applied to various processes, such as surface modification and film deposition.

To be useful for a large area film coating process, the aforesaid single plasma jet may be expanded to multi-plasma jet for large area deposition application. Normally, generation of multiple, separate plasma jets is achieved by a conventional hollow cathode discharging apparatus lying horizontally and equipped with many separate reaction chambers each having a nozzle to enable ejection of the plasma, as disclosed in European Patent No. EP0881865.

Patent No. EP0881865 discloses an apparatus for generating a plurality of low temperature slender plasma jets. Referring to FIG. 2, an apparatus 2 comprises a hollow anode electrode 21 and a hollow cathode electrode 22 insulatedly enclosed by and yet spaced apart from the hollow anode electrode 21. The hollow cathode electrode 22 is connected to a high frequency power generator for generating a high-frequency power source, partitioned into a plurality of separate circular reaction chambers 24 by a plurality of partitions 23, and coaxially penetrated by a gas transfer pipe 25 insulated from the hollow anode electrode 21. A reactive gas required to generate plasma is introduced into the circular reaction chambers 24 through the gas inlet pipe 252. The gas transfer pipe 25 is disposed with gas apertures 251 corresponding in position to the circular reaction chambers 24 respectively. The hollow cathode electrode 22 and the hollow anode electrode 21 are disposed with cathode openings 221 and anode jet holes 211 respectively. The cathode openings 221 and the anode jet holes 211 correspond in position to one another. Confined to the circular reaction chambers 24, free electrons vibrate in such a way as to generate high-density plasma. The high-density plasma was ejected from the anode jet holes 211 to form a plurality of separate plasma jets 26. The separate plasma jets 26 are used in film deposition.

The separate circular reaction chambers 24 are separated from one another by the partitions 23 and adapted to provide a plurality of successive plasma jets 26. Given the extremely high density of the individual plasma jets 26, film deposition is performed fast but slowly in between any two. The speed varies greatly. To achieve uniform film thickness, a substrate 27 is kept away from the anode jet holes 211 by a distance d as great as possible. In so doing, the density of plasma decreases undesirably, thus slowing down the film deposition.

Referring to FIGS. 2 and 3, the circular reaction chambers 24 correspond in position to the gas apertures 251 of the gas transfer pipe 25. Inasmuch as plasma is flew to the vacuum chambers by vacuum suction, poor alignment of the gas apertures 251 prevents uniform distribution of the reactive gas inside the circular reaction chambers 24.

With the gas transfer pipe 25 penetrating the hollow cathode electrode 22 axially, an increase in the diameter of the gas transfer pipe 25 is always accompanied by a decrease in the capacity of the circular reaction chambers 24, thus aggravating non-uniform distribution of the reactive gas. For this reason, the diameter of the gas transfer pipe 25 is necessarily small. Scale up the apparatus 2 in axial, coupled with the small diameter of the gas transfer pipe 25 therefore prevents uniform distribution of the reactive gas inside the slender gas transfer pipe 25. Upon its entry into the separate circular reaction chambers 24 individually, the different reactive gas rate has immediately bearing on different plasma density. The longer the apparatus 2 is, the less is uniformity of plasma density in its axial direction. The disadvantage poses hindrance to large-area film deposition.

Accordingly, an issue facing the industrial sector and calling for urgent solution is to develop a hollow cathode discharging apparatus that facilitates scale-up of a HCD apparatus in axial, high density and uniform plasma distribution was induced by uniform distribution of a reactive gas.

SUMMARY OF THE INVENTION

In light of the aforesaid drawbacks of the prior art, it is a primary objective of the present invention to provide a uniform gas distribution in a hollow cathode discharging apparatus.

Another objective of the present invention is to provide a hollow cathode discharging apparatus with high conductance high enough to facilitate scale-up of the apparatus in axial.

Yet another objective of the present invention is to provide a hollow cathode discharging apparatus adapted to generate slender plasma jets.

A further objective of the present invention is to provide a hollow cathode discharging apparatus adapted to generate high uniformity and high density plasma.

In order to achieve the above and other objectives, the present invention provides a hollow cathode discharging apparatus comprising: a hollow anode electrode disposed with a first chamber and a plurality of anode openings communicating with the first chamber; a hollow cathode electrode insulated from the hollow anode electrode, fixed in the first chamber, and disposed with a second chamber and a plurality of cathode openings communicating with the second chamber and corresponding in position to the anode openings; and a gas distribution pipe fixed in the second chamber, adapted to let in a reactive gas from outside of the hollow anode electrode, wherein defined by the gas distribution pipe and the hollow cathode electrode and along an axis thereof is a spiral pathway winding through the cathode openings so as to form a plurality of continuous and communicated reaction chambers, and the gas distribution pipe is disposed with gas separation apertures communicated and adapted to introduce the reactive gas into the reaction chambers.

The gas distribution pipe of the hollow cathode discharging apparatus is an eccentric pipe proximal to the gas separation apertures and yet distal to the cathode openings. The gas distribution pipe is disposed with an even number of gas separation apertures corresponding in position to the reaction chambers and axially aligned. Preferably, the even number of gas separation apertures face different directions and have symmetry such that the reactive gas in the reaction chambers flow convection. The two ends of the gas distribution pipe are each connected to an insulated gas pipe penetrating and protruding out of the hollow anode electrode so as to let in the reactive gas bilaterally and concurrently. In a preferred embodiment, the gas distribution pipe is disposed with an external spiral portion, such that the external spiral portion and the hollow cathode electrode together define a spiral pathway. In another preferred embodiment, the hollow cathode electrode is disposed with an internal spiral portion, and the spiral pathway is defined by the internal spiral portion and the gas distribution pipe.

The plurality of anode openings and cathode openings correspond in position to the reaction chambers and are aligned axially and separately. In a preferred embodiment, each of the reaction chambers correspond in position to two, left and right, of the cathode openings and anode openings, both open radially and yet in different directions, and the plurality of cathode openings and anode openings correspond in position to the reaction chambers respectively, are aligned axially and separately, and alternate between the left one and the right one. Preferably, the cathode openings and anode openings have a slender cross-section each.

The hollow anode electrode is further disposed with an insulated pipe penetrating the first chamber to connect the hollow cathode electrode to an external high frequency power source cathode. The hollow anode electrode is disposed with two insulated positioning posts at two ends of the first chamber, and the hollow cathode electrode is positioned and insulated against electricity by the two insulated positioning posts. The hollow cathode electrode comprises a hollow cathode tube with two ends each sealed by an end cover. The insulated positioning posts are secured in position to the end covers.

In comparison with the prior art, the present invention discloses the following: a spiral pathway defined with a gas distribution pipe and a hollow cathode electrode and winding through cathode openings along the axis of the hollow cathode electrode, such that the spiral pathway forms a plurality of continuous and communicated reaction chambers; a reactive gas is introduced into the reaction chambers through axially aligned gas separation apertures in such a way as to achieve axial uniform distribution of gas because the reaction chambers communicate with one another. The gas separation apertures aligned in a convection-enhancing way, coupled with the eccentric gas distribution pipe, allow the reactive gas to stay in the reaction chambers longer (i.e. longer residence time) and be uniformly distributed with a view to obtaining high-uniformity, high-density plasma; with the reaction chambers lying in an eccentric way, the gas distribution pipe with a large diameter has high conductance, such that the reactive gas is characterized by easy transfer, quick diffusion, and high uniformity, not to mention that the hollow cathode discharging apparatus of the present invention is capable of axial scale-up; and owing to the slender shapes, directions and relative positions of the anode openings and cathode openings, the resultant slender plasma jets are of high uniformity and high density. Accordingly, the present invention overcomes the drawbacks of the prior art and therefore has high industrial applicability and inventiveness.

DETAILED DESCRIPTION OF THE PREFERRED EMBODIMENTS

The following specific embodiments are provided to illustrate the present invention. Persons skilled in the art can readily gain an insight into other advantages and features of the present invention based on the contents disclosed in this specification.

Figure 1:
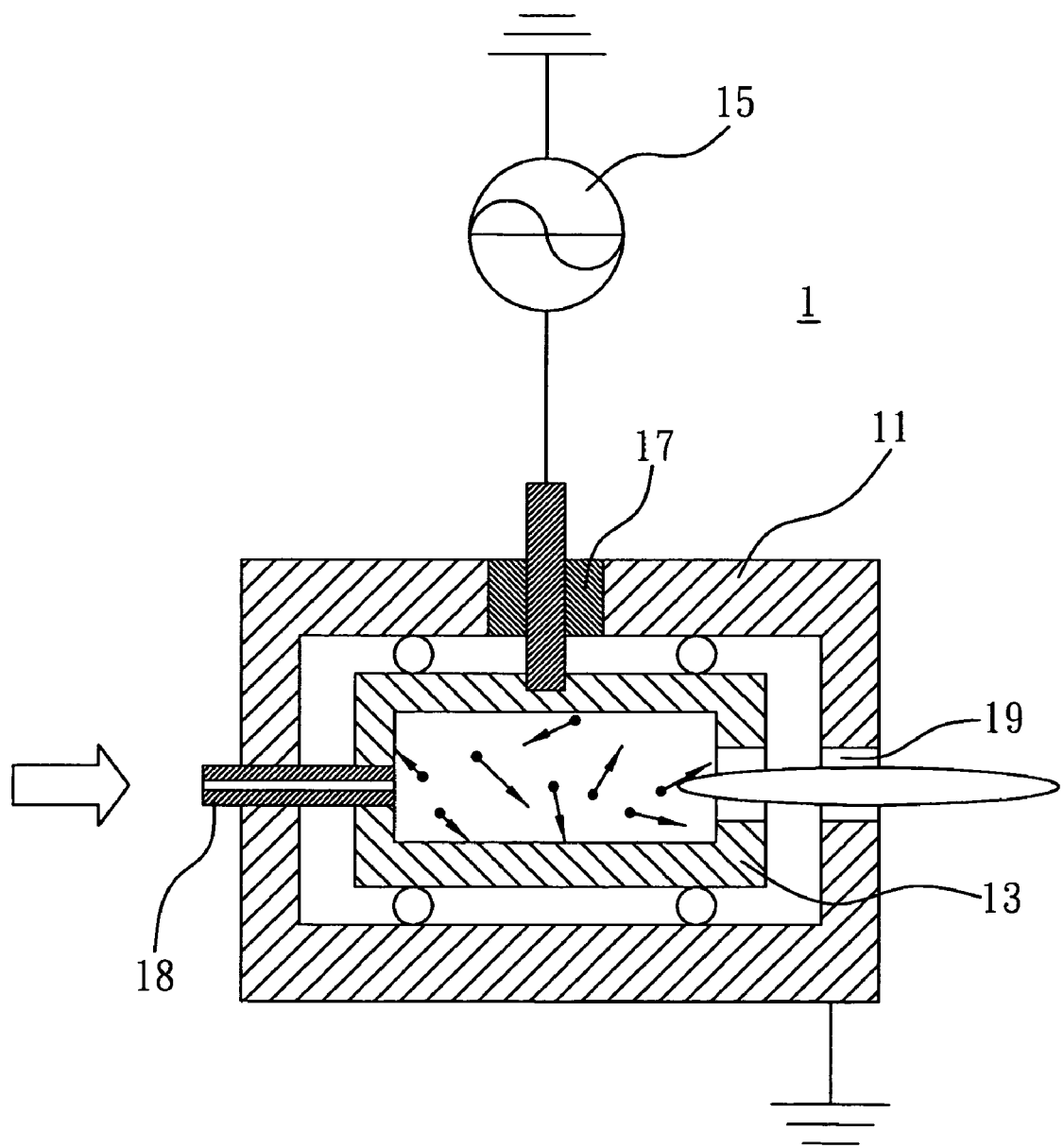
FIG. 1 (PRIOR ART) is a schematic view showing the structure of a conventional hollow cathode discharging apparatus.
Figure 2:
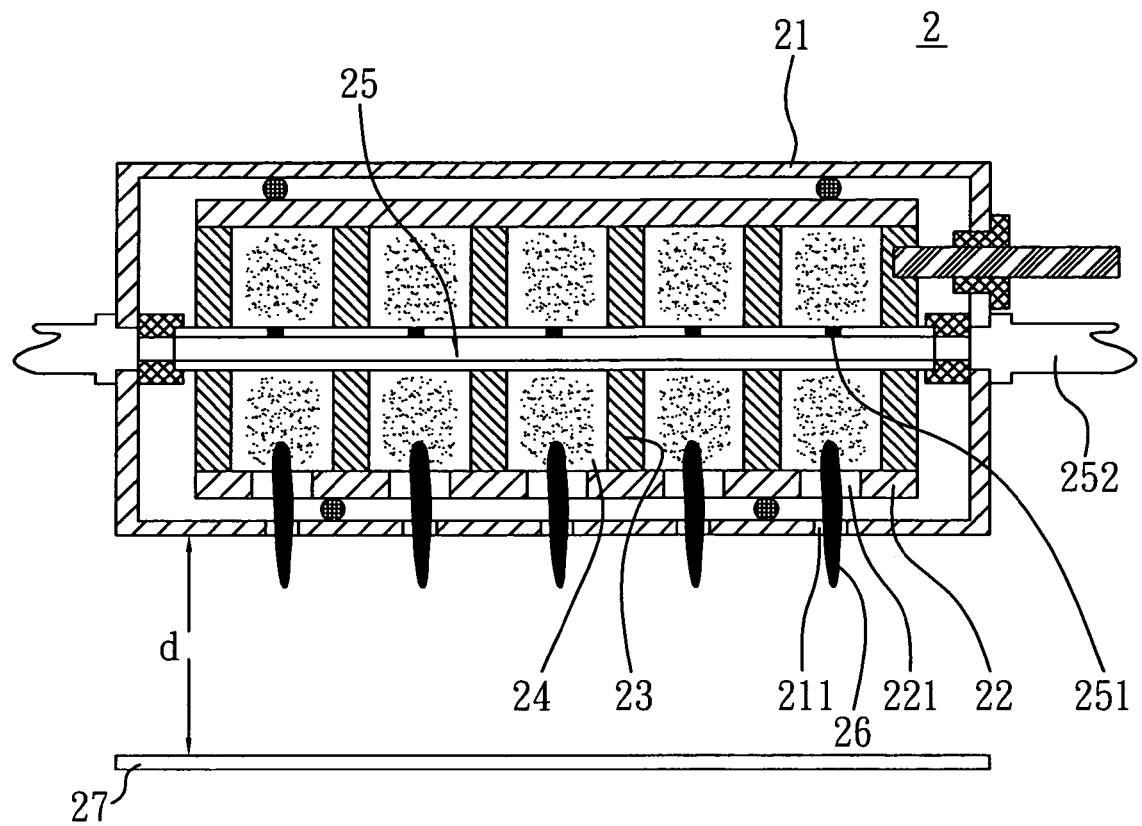
FIG. 2 (PRIOR ART) is a longitudinal cross-sectional view showing an apparatus disclosed in Patent No. EP0881865 for generating a plurality of low temperature slender plasma jets.
Figure 3:
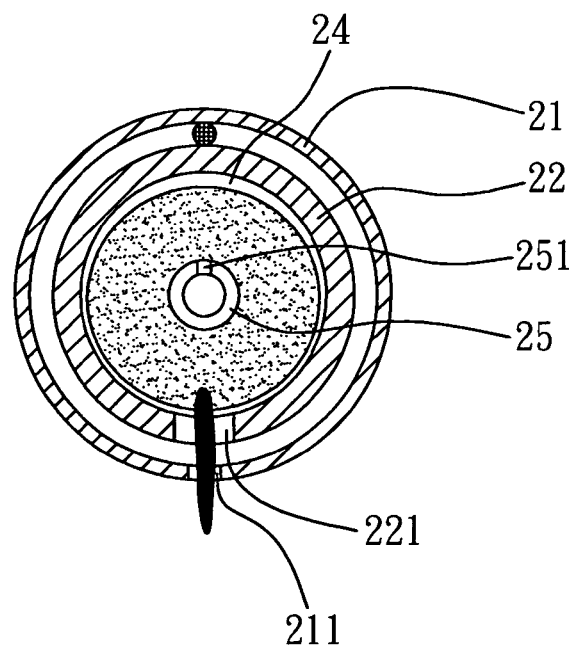
FIG. 3 (PRIOR ART) is a transverse cross-sectional view showing an apparatus disclosed in European Patent No. EP0881865 for generating a plurality of low temperature slender plasma jets.
Figure 4:
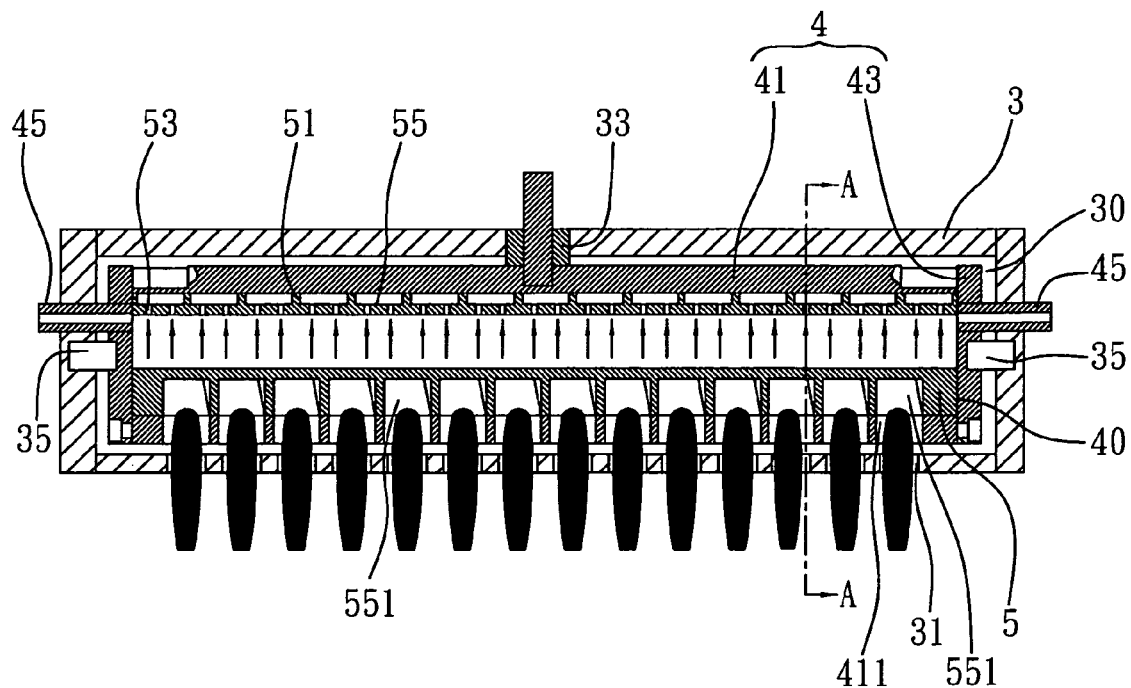
FIG. 4 is a longitudinal cross-sectional view showing a hollow cathode discharging apparatus of the present invention.

Referring to FIG. 4, a hollow cathode discharging apparatus of the present invention comprises: a hollow anode electrode 3 disposed with a first chamber 30 and a plurality of anode openings 31 communicating with the first chamber 30; a hollow cathode electrode 4 insulated from the hollow anode electrode 3, fixed in the first chamber 30, and disposed with a second chamber 40 and a plurality of cathode openings 411 communicating with the second chamber 40 and corresponding in position to the anode openings 31; and a gas distribution pipe 5 fixed in the second chamber 40, adapted to let in a reactive gas from outside of the hollow anode electrode 3 via an insulated gas pipe 45, wherein defined by the gas distribution pipe 5 and the hollow cathode electrode 4 and along an axis thereof is a spiral pathway 55 winding through the cathode openings 411 so as to form a plurality of continuous and communicated reaction chambers 551, and the gas distribution pipe 5 is disposed with gas separation apertures 53 communicated and adapted to introduce the reactive gas into the reaction chambers 551. The reaction chambers 551 communicating with one another enable axial uniform distribution of the reactive gas and facilitate axial scale-up of the hollow cathode discharging apparatus of the present invention. Accordingly, the present invention has inventiveness over the prior art.

Figure 5:
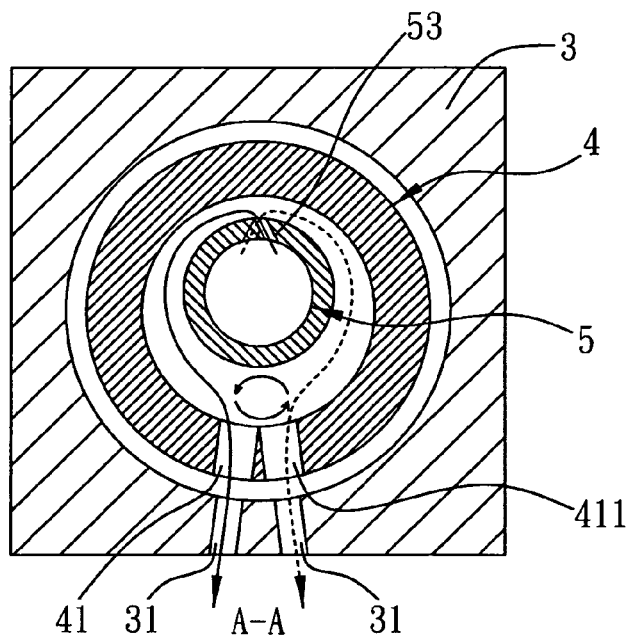
FIG. 5 is a transverse cross-sectional view taken along the section line A-A of FIG. 4 showing a hollow cathode discharging apparatus of the present invention.
Figure 6:
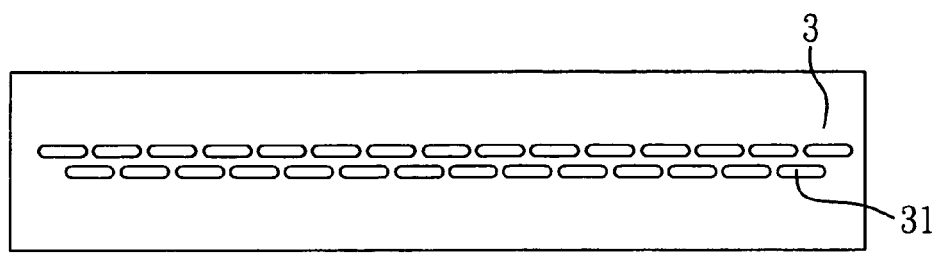
FIG. 6 is a bottom plan view showing a hollow cathode discharging apparatus of the present invention.

Referring to FIGS. 4, 5 and 6 as well, the hollow anode electrode 3 is disposed with the first chamber 30 having a round cross-section and a plurality of anode openings 31 axially and separately aligned and communicating with the first chamber 30. In this embodiment, the plurality of anode openings 31 are aligned in such a way as to flank the axis of the hollow anode electrode 3 and be symmetrical relative thereto. In other words, each of the reaction chambers 551 correspond in position to two, left and right, of the anode openings 31, both open radially and yet in different directions, and the plurality of anode openings 31 correspond in position to the reaction chambers 551 respectively, are aligned axially and separately, and alternate between the left one and the right one. Each of the anode openings 31 has a slender cross-section.

With the slender cross-section of the anode openings 31, the high-density plasma ejected from the reaction chambers 551 appears in the form of slender plasma jets instead of the point-like plasma jets of the prior art, and thus film deposition performed at a high deposition speed is characterized by uniform film thickness.

The hollow cathode electrode 4 is disposed with the second chamber 40 having a round cross-section and the plurality of cathode openings 411 axially and separately aligned and communicating with the second chamber 40. In this embodiment, the hollow cathode electrode 4 comprises a hollow cathode tube 41 with two ends each sealed by an end cover 43. The insulated positioning posts 35 are secured in position to the end covers 43. Secured in position to the end covers 43 is the insulated gas pipe 45 connected to two ends of the gas distribution pipe 5 and penetratingly protruding out of the hollow anode electrode 3 so as to let in the reactive gas bilaterally and concurrently.

In this embodiment, a plurality of cathode openings 411 are also aligned in such a way as to flank the axis of the hollow cathode electrode 4. In other words, each of the reaction chambers 551 correspond in position to two, left and right, of the cathode openings 411, both open radially and yet in different directions, and the plurality of cathode openings 411 correspond in position to the reaction chambers 551 respectively, are aligned axially and separately, and alternate between the left one and the right one. The cathode openings 411 correspond in position to the anode openings 31 and have a slender cross-section each.

The gas distribution pipe 5 is disposed in the second chamber 40 of the hollow cathode electrode 4. Two ends of the gas distribution pipe 5 are each connected to the insulated gas pipe 45 penetrating and protruding out of the hollow anode electrode 3 so as to let in the reactive gas bilaterally and concurrently. In this embodiment, the gas distribution pipe 5 is disposed with an external spiral portion 51 axially winding through the cathode openings 411 such that the external spiral portion 51 and the hollow cathode electrode 4 together define the spiral pathway 55 for forming the plurality of continuous and communicated reaction chambers 551 corresponding in position to the cathode openings 411. The gas distribution pipe 5 is disposed with the gas separation apertures 53 communicated and adapted to introduce the reactive gas into the reaction chambers 551.

Figure 7:
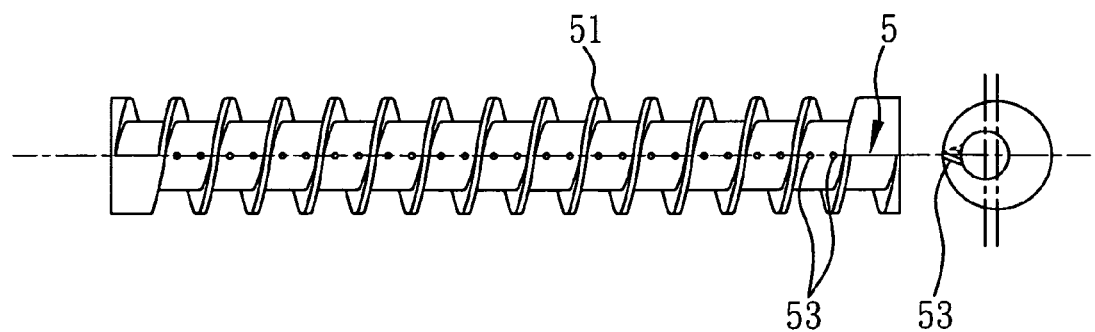
FIG. 7 is a schematic view showing a gas distribution pipe of a hollow cathode discharging apparatus of the present invention.

The reactive gas is let in through the two ends of the gas distribution pipe 5, delivered to the reaction chambers 551 through the axially aligned gas separation apertures 53, and uniformly distributed in the reaction chambers 551 communicating with one another. Referring to FIGS. 5 and 7, in this embodiment, the gas distribution pipe 5 is an eccentric pipe proximal to the gas separation apertures 53 and yet distal to the cathode openings 411. The gas distribution pipe 5 is disposed with an even number of the gas separation apertures 53 axially aligned, corresponding in position to the reaction chambers 551, facing different directions, and demonstrating symmetry.

The reactive gas introduced into the reaction chambers 551 through the gas separation apertures 53 flows in different directions, and the resultant convection and diffusion of the reactive gas enhances the uniformity and prolongs the retention (i.e. increases the residence time) of the reactive gas in the reaction chambers 551, thus increasing the ionization of the reactive gas and the excitation of plasma of density higher than that achieved by the prior art. With the reaction chambers lying in an eccentric way, the gas distribution pipe 5 with a large diameter has high conductance, such that the reactive gas features easy transfer, quick diffusion, and high uniformity. As a result, the hollow cathode discharging apparatus of the present invention is capable of scale-up in axial.

As described above, the spiral pathway 55 is defined by the external spiral portion 51 of the gas distribution pipe 5 and the hollow cathode electrode 4, and thus the spiral pathway 55 allows the reaction chambers 511 to communicate with one another; as a result, the ejected plasma appears in the form of high-density, high-uniformity plasma jets, and it is feasible to increase the diameter of the gas distribution pipe 5 to facilitate axial scale-up of the hollow cathode discharging apparatus of the present invention. Although this embodiment discloses the eccentric gas distribution pipe 5, other embodiments may disclose a concentric gas distribution pipe and still achieve the aforesaid objectives of the present invention. Persons of ordinary skill in the art are well aware of and capable of implementing an eccentric or concentric gas distribution pipe. Hence, the aforesaid concentric gas distribution pipe is not otherwise illustrated herein with any drawings.

Likewise, owing to the design and function of the spiral pathway 55, even if the shape and alignment of the cathode openings 411 and the anode openings 31 disclosed in this embodiment are replaced by a round shape and simple axial separate alignment, the aforesaid objectives of the present invention can be achieved anyway. Persons of ordinary skill in the art are well aware of and capable of implementing the aforesaid variation. Hence, the aforesaid variation is not otherwise illustrated herein with any drawings.

To enhance convection of the reactive gas in the reaction chambers 551, this embodiment discloses the even number of gas separation apertures 53 facing different directions and demonstrating symmetry. However, in the event of only one gas separation aperture 53 installed, convection and uniform distribution of the reactive gas in the reaction chambers 551 will still occur to the full. For this reason, the quantity and direction of the gas separation apertures 53 are not limited to the disclosure contained in this embodiment.

Although this embodiment discloses defining the spiral pathway 55 with the external spiral portion 51 of the gas distribution pipe 5, other embodiments may disclose an internal spiral portion of the hollow cathode electrode 4 such that the spiral pathway 55 is defined by the internal spiral portion and the gas distribution pipe 5. Persons of ordinary skill in the art are well aware of and capable of implementing the variation. Hence, the variation is not otherwise illustrated herein with any drawings.

Summarizing the above, the present invention discloses the following: a spiral pathway defined by a gas distribution pipe and a hollow cathode electrode, winding through cathode openings axially, thus forming a plurality of continuous and communicated reaction chambers for achieving axial uniformity of the reactive gas; an eccentric gas distribution pipe resulting in formation of the eccentric reaction chambers; introducing the reactive gas into the reaction chambers in different directions through paired gas separation apertures so as to enhance convection, prolong residence time, increase uniform distribution of the reactive gas in the reaction chambers with a view to obtaining high-uniformity, high-density plasma. With the reaction chambers lying in an eccentric way, the gas distribution pipe with a large diameter has high conductance, such that the reactive gas is characterized by easy transfer, quick diffusion, and high uniformity, not to mention that the hollow cathode discharging apparatus of the present invention is capable of scale-up in axial. Owing to the slender shapes, directions and relative positions of the anode openings and cathode openings, the resultant plasma jets are slender and of high uniformity and high density. Accordingly, the present invention overcomes the drawbacks of the point-like plasma jets disclosed in the prior art.

The aforesaid embodiments merely serve as the preferred embodiments of the present invention. They should not be construed as to limit the scope of the present invention in any way. Hence, any other changes can actually be made in the present invention. It will be apparent to those skilled in the art that all equivalent modifications or changes made, without departing from the spirit and the technical concepts disclosed by the present invention, should fall within the scope of the appended claims.

What is claimed is:

1. A hollow cathode discharging apparatus, comprising:
a hollow anode electrode disposed with a first chamber and a plurality of anode openings communicating with the first chamber;
a hollow cathode electrode insulated from the hollow anode electrode, fixed in the first chamber, and disposed with a second chamber and a plurality of cathode openings communicating with the second chamber and corresponding in position to the anode openings; and
a gas distribution pipe fixed in the second chamber, adapted to let in a reactive gas from outside of the hollow anode electrode, wherein defined by the gas distribution pipe and the hollow cathode electrode and along an axis thereof is a spiral pathway winding through the cathode openings so as to form a plurality of continuous and communicated reaction chambers, and the gas distribution pipe is disposed with gas separation apertures communicated and adapted to introduce the reactive gas into the reaction chambers.

2. The hollow cathode discharging apparatus of claim 1, wherein the gas distribution pipe is disposed with an external spiral portion, and the spiral pathway is defined by the external spiral portion and the hollow cathode electrode.

3. The hollow cathode discharging apparatus of claim 1, wherein the hollow cathode electrode is disposed with an internal spiral portion, and the spiral pathway is defined by the internal spiral portion and the gas distribution pipe.

4. The hollow cathode discharging apparatus of claims 1 or 2, wherein the gas distribution pipe is an eccentric pipe.

5. The hollow cathode discharging apparatus of claim 1, wherein the gas distribution pipe is an eccentric pipe proximal to the gas separation apertures and yet distal to the cathode openings.

6. The hollow cathode discharging apparatus of claim 1, wherein the gas distribution pipe is disposed with an even number of the gas separation apertures corresponding in position to the reaction chambers and axially aligned.

7. The hollow cathode discharging apparatus of claim 6, wherein the even number of the gas separation apertures face different directions and have symmetry.

8. The hollow cathode discharging apparatus of claim 1, wherein two ends of the gas distribution pipe are each connected to an insulated gas pipe penetrating and protruding out of the hollow anode electrode so as to let in the reactive gas bilaterally and concurrently.

9. The hollow cathode discharging apparatus of claim 1, wherein the plurality of anode openings and cathode openings correspond in position to the reaction chambers respectively and are aligned axially and separately.

10. The hollow cathode discharging apparatus of claim 1, wherein each of the reaction chambers correspond in position to two, left and right, of the cathode openings and anode openings, both open radially and yet in different directions, and the plurality of cathode openings and anode openings correspond in position to the reaction chambers respectively, are aligned axially and separately, and alternate between the left one and the right one.

11. The hollow cathode discharging apparatus of claims 1, 9 or 10, wherein the cathode openings and the anode openings have a slender cross-section each.

12. The hollow cathode discharging apparatus of claim 1, wherein the hollow anode electrode is further disposed with an insulated pipe penetrating the first chamber to connect the hollow cathode electrode to an external high frequency power source.

13. The hollow cathode discharging apparatus of claim 1, wherein the hollow anode electrode is disposed with two insulated positioning posts at two ends of the first chamber, and the hollow cathode electrode is positioned and insulated against electricity by the two insulated positioning posts.

14. The hollow cathode discharging apparatus of claim 1, wherein the hollow cathode electrode comprises a hollow cathode tube with two ends each sealed by an end cover.

* * * * *